United States Patent
Lai et al.

(10) Patent No.: US 7,030,459 B2
(45) Date of Patent: Apr. 18, 2006

(54) THREE-DIMENSIONAL MEMORY STRUCTURE AND MANUFACTURING METHOD THEREOF

(75) Inventors: Erh-Kun Lai, Taichung (TW); Ming-Chung Liang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/906,779

(22) Filed: Mar. 7, 2005

(65) Prior Publication Data
US 2005/0133883 A1 Jun. 23, 2005

Related U.S. Application Data

(63) Continuation of application No. 10/604,042, filed on Jun. 24, 2003, now abandoned.

(51) Int. Cl.
*H01L 29/00* (2006.01)
(52) U.S. Cl. ............... 257/530; 438/131; 438/600
(58) Field of Classification Search ............. 257/530; 438/131, 600
See application file for complete search history.

(56) References Cited

U.S. PATENT DOCUMENTS

| | | | |
|---|---|---|---|
| 6,351,406 B1 * | 2/2002 | Johnson et al. | 365/103 |
| 6,420,215 B1 * | 7/2002 | Knall et al. | 438/131 |
| 6,657,278 B1 * | 12/2003 | Lee | 257/530 |
| 6,689,644 B1 * | 2/2004 | Johnson | 438/131 |
| 6,853,049 B1 * | 2/2005 | Herner | 257/529 |
| 6,952,043 B1 * | 10/2005 | Vyvoda et al. | 257/530 |
| 2002/0081782 A1 * | 6/2002 | Cleeves | 438/131 |
| 2003/0030148 A1 * | 2/2003 | Herner et al. | 257/770 |
| 2003/0155569 A1 * | 8/2003 | Lee | 257/20 |

* cited by examiner

*Primary Examiner*—Jennifer Kennedy
(74) *Attorney, Agent, or Firm*—Jiang Chyun IP Office

(57) ABSTRACT

A three-dimensional memory structure and manufacturing method thereof is provided. A first stack layer is formed over a substrate. The first stack layer includes, from the substrate upwards, an n-type polysilicon layer, a conductive layer, an anti-fuse and another n-type polysilicon layer. The first stack layer is patterned to form a first stack circuit. Thereafter, a second stack layer is formed over the first stack circuit. The second stack layer includes, from the first stack circuit upwards, a p-type polysilicon layer, a conductive layer, an anti-fuse and another p-type polysilicon. The second stack layer is patterned to form a second stack circuit that crosses over the first stack circuit perpendicularly. The aforementioned steps are repeated to form more stack circuits above the substrate and hence produce a three-dimensional structure.

17 Claims, 10 Drawing Sheets

THREE-DIMENSIONAL MEMORY STRUCTURE AND MANUFACTURING METHOD THEREOF

CROSS-REFERENCE TO RELATED APPLICATION

This application is a continuation of a prior application Ser. No. 10/604,042, filed Jun. 24, 2003 now abandoned.

BACKGROUND OF THE INVENTION

1. Field of Invention

The present invention relates to a three-dimensional memory structure and manufacturing method thereof. More particularly, the present invention relates to a vertically stacked three-dimensional memory array and manufacturing method thereof.

2. Description of Related Art

Due to the rapid development of integrated circuit technologies, each integrated circuit contains an increasing number of electronic devices. Memory is a common semiconductor device most often used inside a personal computer and some electronic equipment. Earlier, each memory includes an array of memory cells on a single layer over a semiconductor substrate. The cross over area between each column and row constitutes a specified memory cell address. In general, memory cells within the same column or the same row have a common conductive wire connection. With this design, the only way to increase the level of integration is to reduce the size of each memory cell. A vertical stacked non-volatile memory structure is disclosed in U.S. Pat. No. 6,351,406. The method includes forming a three-dimensional multi-layered array memory structure over a substrate with each array layer having a plurality of memory cells such that the memory cells in the same column or row are connected to a common conductive wire.

FIG. 1 is a front view of a conventional three-dimensional multi-layered memory array structure. As shown in FIG. 1, if a first patterned conductive layer 1 lies in an east/west direction and a second patterned conductive layer 3 lies in a south/north direction above the first patterned conductive layer 1, a cylindrical memory cell 5 is formed in the area of intersection between the vertical projection of the second patterned conductive layer 3 and the first patterned conductive layer 1. Furthermore, if a third patterned conductive layer 7 lies in an east/west direction, a cylindrical memory cell 9 is formed in the area of intersection between the vertical projection of the third patterned conductive layer 7 and the second patterned conductive layer 3. In other words, according to the aforementioned stacking method, even-numbered patterned conductive layers lie in a south/north direction and odd-numbered patterned conductive layers lie in an east/west direction.

Although U.S. Pat. No. 6,351,406 has proposed a method of manufacturing a vertical stacked non-volatile memory for increasing overall level of device integration, the method requires N+1 photolithographic processes to form the N memory cell array layers over a substrate. Along with the photolithographic steps needed to producing interconnecting vias, the total number of processing steps is exceptionally high. In other words, the stacked three-dimensional memory is rather difficult and costly to manufacture.

SUMMARY OF THE INVENTION

Accordingly, one object of the present invention is to provide a three-dimensional memory structure and manufacturing method thereof that only involves simple processing steps.

A second object of this invention is to provide a three-dimensional memory structure and manufacturing method thereof capable of increasing overall level of integration of the memory devices.

To achieve these and other advantages and in accordance with the purpose of the invention, as embodied and broadly described herein, the invention provides a three-dimensional memory structure. The memory structure comprises a multiple of stacked circuits. The first stacked circuit includes two n-type polysilicon layers, a conductive layer and an anti-fuse. The anti-fuse and the conductive layer are located between the n-type polysilicon layers. Hence, the first stacked circuit includes an n-type polysilicon layer/anti-fuse/conductive layer/n-type polysilicon layer (N/A/C/N) setup and an n-type polysilicon layer/conductive layer/anti-fuse/n-type polysilicon layer (N/C/A/N) setup.

The second stacked circuit of the three-dimensional memory structure includes two p-type polysilicon layers, a conductive layer and an anti-fuse. The anti-fuse and the conductive layer are located between the p-type polysilicon layers. Hence, the second stacked circuit includes a p-type polysilicon layer/conductive layer/anti-fuse/p-type polysilicon layer (P/C/A/P) setup and a p-type polysilicon layer/anti-fuse/conductive layer/p-type polysilicon layer (P/A/C/P) setup. The second stacked circuit and the first stacked circuit cross over and perpendicular to each other. Therefore, a total of four different methods of combining the first stacked circuit and the second stacked circuit are possible. In addition, according to the memory capacity, one of the four aforementioned configurations can be used to form more stacked circuits over the substrate.

This invention also provides a method of fabricating a three-dimensional memory structure. First, an n-type polysilicon layer/conductive layer/anti-fuse/n-type polysilicon layer (N/C/A/N) stack structure is formed over a substrate. The N/C/A/N stack structure is patterned to form an array of linear first stacked lines. Thereafter, a dielectric layer is formed in the space between the first stacked lines above the substrate. The dielectric layer is planarized to expose the topmost n-type polysilicon layer of the first stacked lines. A p-type polysilicon/conductive layer/anti-fuse/p-type polysilicon layer (P/C/A/P) stacked structure is formed over the topmost n-type polysilicon layer of the first stacked line. Next, the P/C/A/P stacked structure and the topmost n-type polysilicon layer of the first stacked line is patterned to form an array of linear second stacked lines that crosses over and perpendicular to the first stacked lines. Another dielectric layer is formed in the space between the second stacked lines above the anti-fuse of the first stacked lines. The dielectric layer is again planarized to expose the topmost p-type polysilicon layer of the second stacked lines. The overlapping areas between the first stacked lines and the second stacked lines forms an array of cylindrical memory cells. The aforementioned processing steps are repeated to form more stacked lines and hence build up a three-dimensional memory structure.

A three-dimensional multi-layered memory array structure is used in this invention. The odd-numbered memory cell array and the even-numbered memory cell array of the three-dimensional structure are alternately stacked over each other and oriented in a direction perpendicular to each other above the substrate. Hence, substrate area required to accommodate the memory device is reduced and overall level of integration of the memory chip is increased. Moreover, in the fabrication process, the anti-fuse is used as an etching stop layer. Since the anti-fuse is fabricated from silicon oxide, the anti-fuse has a relatively high etching selectivity ratio relative to the polysilicon and the conductive layer. Therefore, the processing window is increased and the steps for fabricating the three-dimensional memory are simplified. Furthermore, the steps of forming via is to break through the anti-fuse after etching stop on the anti-fuse, so it can effectively etch stop on the conductive layer. Therefore, it can prevent via from forming p-n or n-p rectification junction due to the conductive layer being perforated, resulting in non-conducting.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
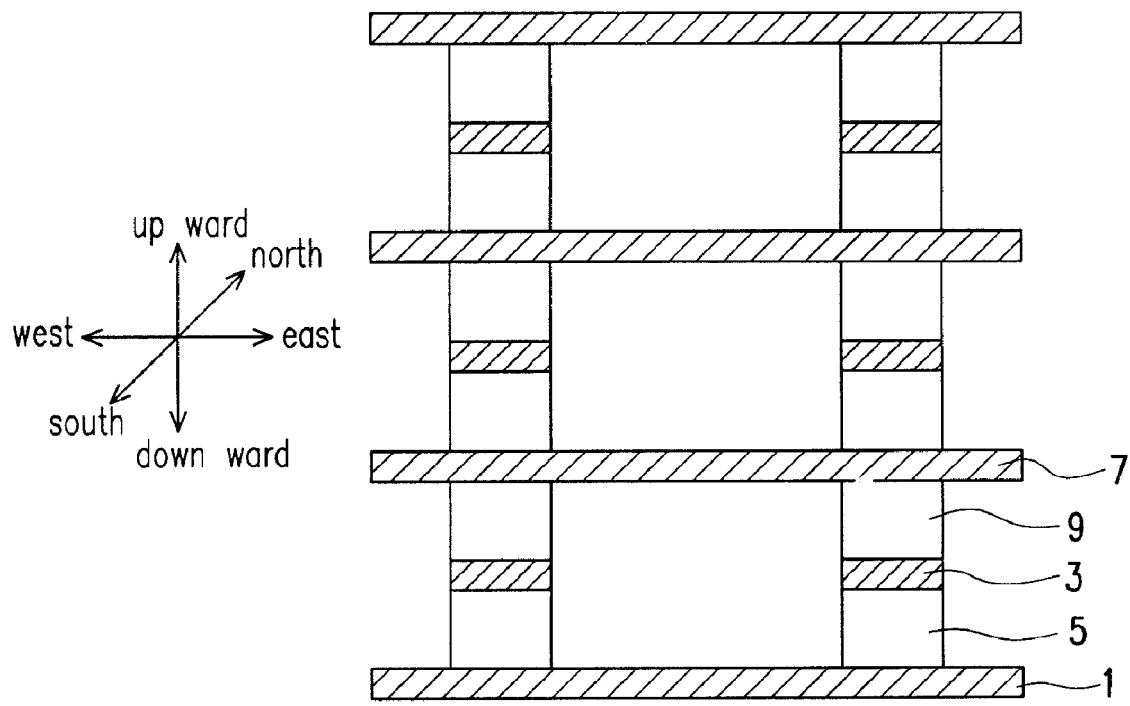
FIG. 1 is a front view of a conventional three-dimensional multi-layered memory array structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
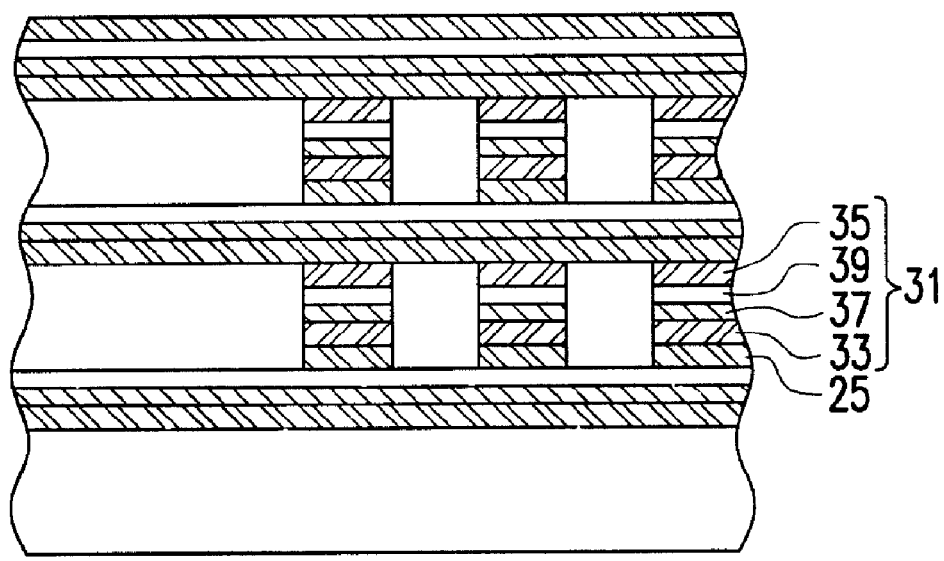
FIGS. 2A and 2B are front views and side view of a three-dimensional memory structure according to one preferred embodiment of this invention.
Figure 2B:
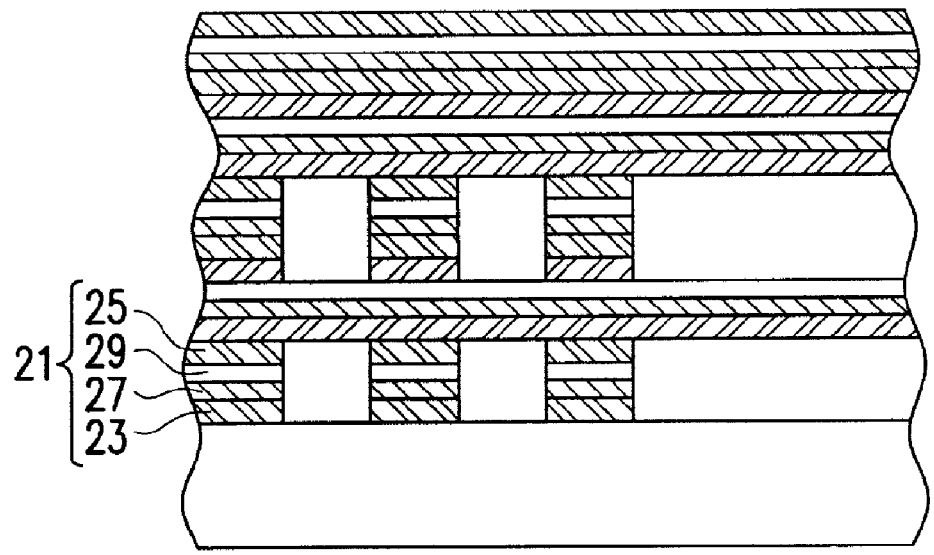

FIGS. 2A and 2B are front views and side view of a three-dimensional memory structure according to one preferred embodiment of this invention. As shown in FIGS. 2A and 2B, the three-dimensional structure comprises of a stack of circuit layers. The first stack circuit 21 includes two n-type polysilicon layers 23 and 25, a conductive layer 27 and an anti-fuse 29. The anti-fuse 29 is a silicon oxide layer and the conductive layer 27 is a tungsten silicide or a titanium silicide layer, for example. The conductive layer 27 of the first stack circuit 21 is located between the two n-type polysilicon layers 23 and 25. The anti-fuse 29 is located between the n-type polysilicon layer 25 and the conductive layer 27. Hence, the first stack circuit 21 has an n-type polysilicon/conductive layer/anti-fuse/n-type polysilicon (N/C/A/N) setup. The second stack circuit 31 of the three-dimensional memory structure includes two p-type polysilicon layers 33 and 35, another conductive layer 37, and another anti-fuse 39. The conductive layer 37 of the second stack circuit 31 is located between the p-type polysilicon layers 33 and 35. The anti-fuse 39 is located between the p-type polysilicon layer 35 and the conductive layer 37. Hence, the second stack circuit 31 has a p-type polysilicon/conductive layer/anti-fuse/p-type polysilicon (P/C/A/P) setup. The second stack circuit 31 crosses over and is perpendicular to the first stack circuit 21. In this invention, memory capacity of the three-dimensional structure depends on the number of stack circuits over the substrate. Hence, stacking more circuits on top of the substrate will increase the overall memory capacity.

In general, there are other types of setups for the various layers inside the aforementioned stack circuit. For example, the first stack circuit 21 can have an n-type polysilicon/anti-fuse/conductive layer/n-type polysilicon (N/A/C/N) setup and the second stack circuit 31 can have a p-type polysilicon/anti-fuse/conductive layer/p-type polysilicon setup. In fact, there are four different setups for combining the first stack circuit 21 and the second stack circuit 31 together.

Figure 3A:
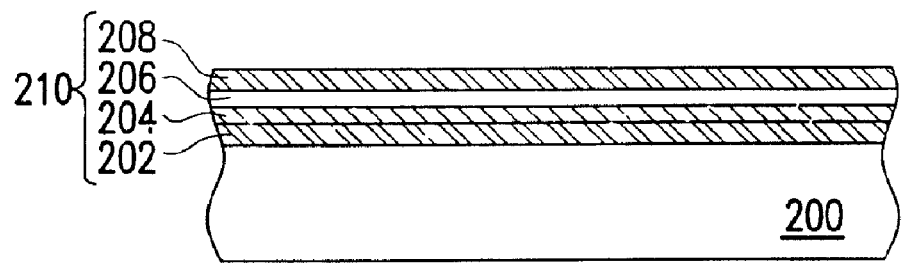
FIGS. 3A to 3G are front views showing the progression of steps for forming the three-dimensional memory structure shown in FIGS. 2A and 2B.

FIGS. 3A to 3G are front views showing the progression of steps for forming the three-dimensional memory structure shown in FIGS. 2A and 2B. FIGS. 4A to 4G are side views that correspond with the front views shown in FIGS. 3A to 3G. As shown in FIGS. 3A and 4A, a substrate 200 such as a silicon substrate is provided. Thereafter, an n-type polysilicon layer 202, a conductive layer 204, an anti-fuse 206 and another n-type polysilicon layer 208 are sequentially formed over the substrate 200. The n-type polysilicon layer 202 and 208 are formed, for example, by conducting an in-situ doping using phosphene as a gaseous source. The conductive layer 204 is a tungsten silicide layer or a titanium silicide layer, for example. The conductive layer 204 is formed, for example, by conducting a low-pressure chemical vapor deposition. The anti-fuse 206 is fabricated using a material having an etching selectivity ratio higher than the n-type polysilicon layers 202, 208 and the conductive layer 204 including, for example, silicon oxide. The anti-fuse 206 is formed, for example, by conducting a low-pressure chemical vapor deposition.

The n-type polysilicon layer 202, the conductive layer 204, the anti-fuse 206 and the n-type polysilicon layer 208 are patterned to form an array of linear first stack circuits 210 each having an n-type polysilicon/conductive layer/anti-fuse/n-type polysilicon (N/C/A/N) composite layer setup. Thereafter, a dielectric layer 10 is formed in the space between the first stack circuits 210. The dielectric layer 10 is, for example, a silicon oxide layer, a silicon nitride layer or a spin-coated glass layer. The dielectric layer 10 is formed, for example, by performing a high-density plasma chemical vapor deposition or a spin-coating process.

A portion of the dielectric layer 10 is removed to expose the topmost n-type polysilicon layer 208. The dielectric layer 10 above the n-type polysilicon layer 208 is removed, for example, by chemical-mechanical polishing or conducting an etching back process.

Figure 3B:
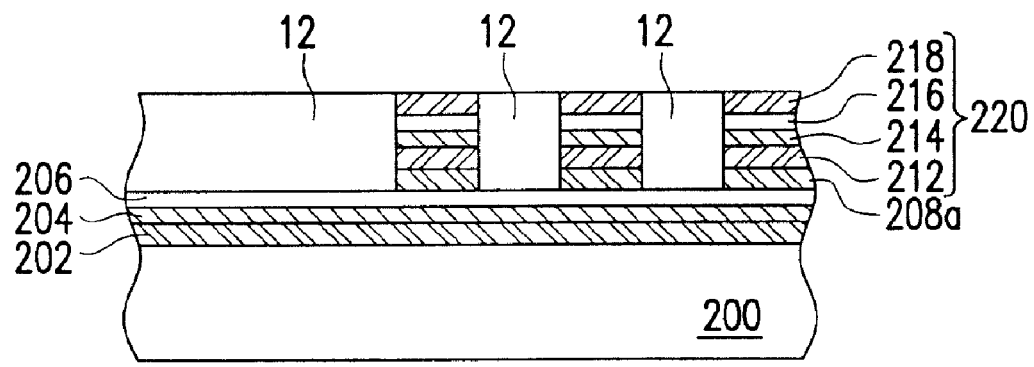
Figure 4A:
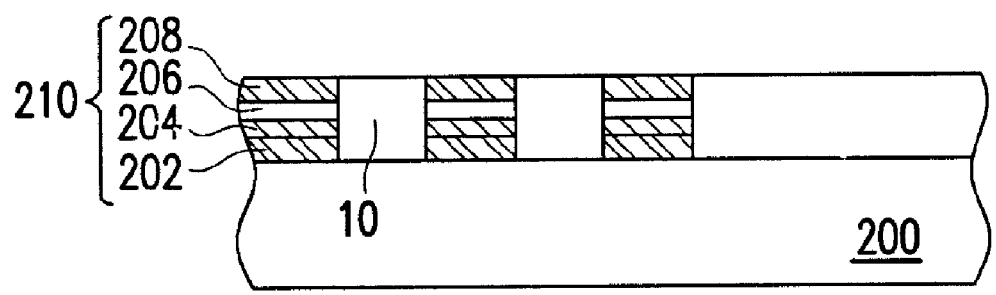
FIGS. 4A to 4G are side views that correspond with the front views shown in FIGS. 3A to 3G.
Figure 4B:
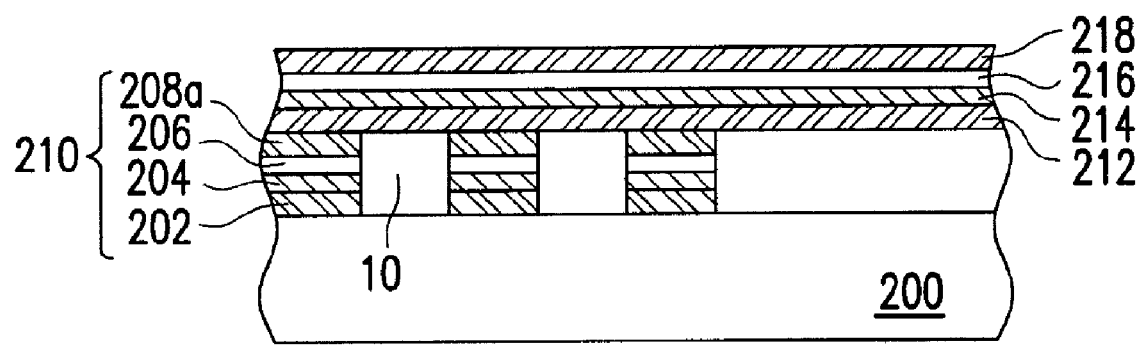

As shown in FIGS. 3B and 4B, a p-type polysilicon layer 212, a conductive layer 214, an anti-fuse 216 and another p-type polysilicon layer 218 are sequentially formed over the n-type polysilicon layer 208. The p-type polysilicon layer 212 and 218 are formed, for example, by conducting an in-situ doping using boron hydride as a gaseous source. The conductive layer 214 is a tungsten silicide layer or a titanium silicide layer, for example. The conductive layer 214 is formed, for example, by conducting a low-pressure chemical vapor deposition. The anti-fuse 216 is fabricated using a material having an etching selectivity ratio higher than the p-type polysilicon layers 212, 218 and the conductive layer 214 including, for example, silicon oxide. The anti-fuse 216 is formed, for example, by conducting a low-pressure chemical vapor deposition.

The p-type polysilicon layer 212, the conductive layer 214, the anti-fuse 216, the p-type polysilicon layer 218 are patterned to form an array of linear second stack circuits 220 each having a p-type polysilicon/conductive layer/anti-fuse/p-type polysilicon (P/C/A/P) composite layer setup. In the same patterning process, the n-type polysilicon layer 208 is also patterned to form the n-type polysilicon layer 208a, wherein the pattern of the n-type polysilicon layer 208a is substantially conformal to the shape of the interaction between each second stack circuit 220 and each first stack circuit 210. In essence, each first stack circuit 210 has the n-type polysilicon layer 202, the conductive layer 204, the anti-fuse 206 and the n-type polysilicon layer 208a composite layer setup. Further, the second stack circuits 220 are oriented in a direction perpendicular to and above the first stack circuits 210. In patterning the second stack circuits 220, the anti-fuse serves as an etching stop layer. Thereafter, a dielectric layer 12 is formed in the space between the second stack circuits 220. The dielectric layer 12 is, for example, a silicon oxide layer, a silicon nitride layer or a spin-coated glass layer. The dielectric layer 12 is formed, for example, by performing a high-density plasma chemical vapor deposition or a spin-coating process.

A portion of the dielectric layer 12 is removed to expose the topmost p-type polysilicon layer 218. The dielectric layer 12 above the p-type polysilicon layer 218 is removed, for example, by chemical-mechanical polishing or conducting an etching back process.

Figure 3C:
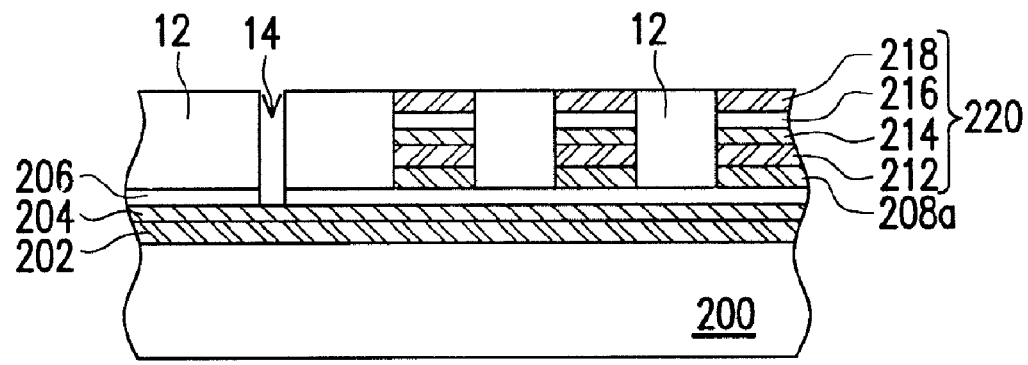
Figure 4C:
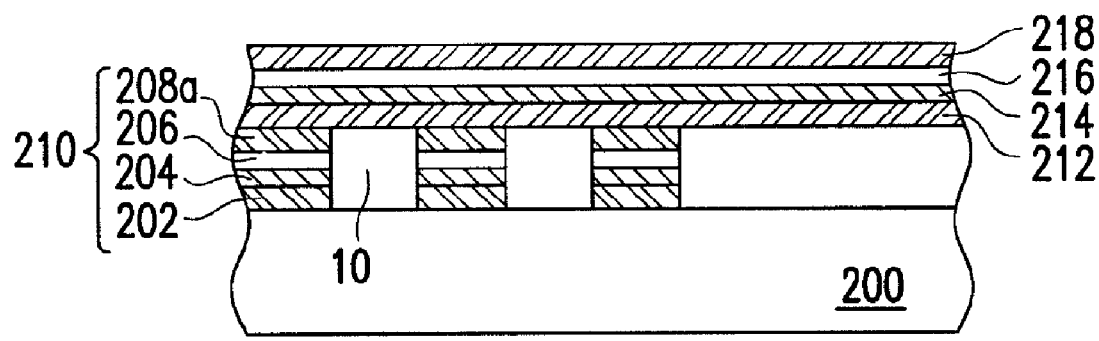

As shown in FIGS. 3C and 4C, the dielectric layer 12 and the anti-fuse 206 are patterned to form an opening 14 above the conductive layer 204.

Figure 3D:
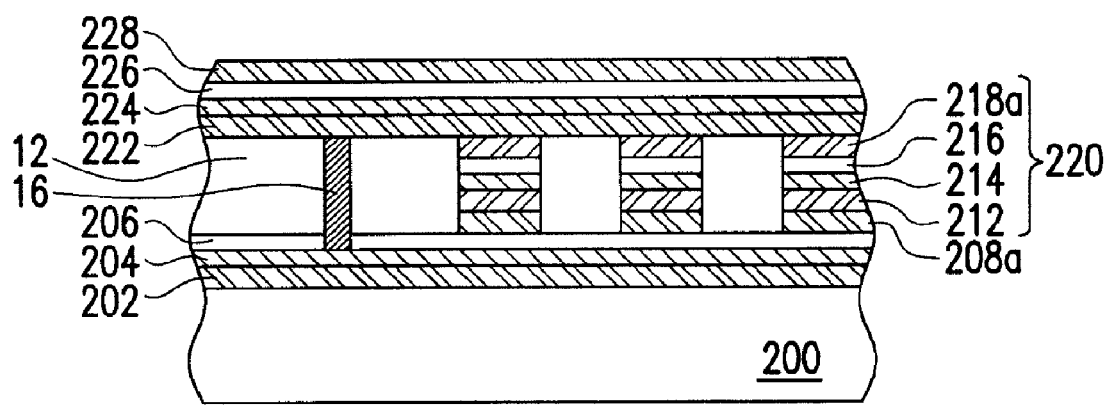
Figure 4D:
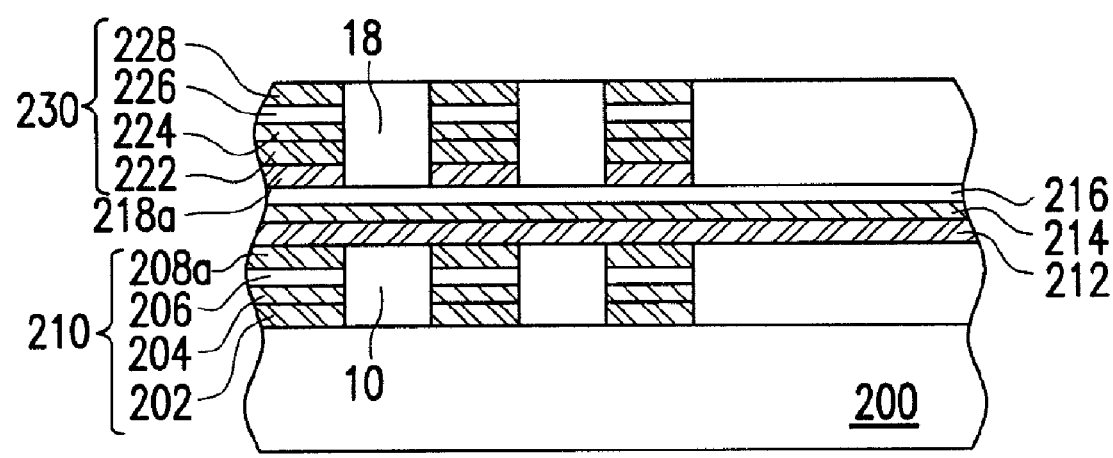

As shown in FIGS. 3D and 4D, n+ polysilicon material is deposited into the opening 14 to form a plug 16. Thereafter, an n-type polysilicon layer 222, a conductive layer 224, an anti-fuse 226 and another n-type polysilicon layer 228 are sequentially formed over the p-type polysilicon layer 218. The n+ polysilicon plug 16 connects the conductive layer 204 and the n-type polysilicon layer 222 electrically. The n-type polysilicon layers 222 and 228 are formed, for example, by conducting an in-situ doping using phosphene as a gaseous source. The conductive layer 224 is a tungsten silicide layer or a titanium silicide layer, for example. The conductive layer 224 is formed, for example, by conducting a low-pressure chemical vapor deposition. The anti-fuse 226 is fabricated using a material having an etching selectivity ratio higher than the n-type polysilicon layers 222, 228 and the conductive layer 224 including, for example, silicon oxide. The anti-fuse 226 is formed, for example, by conducting a low-pressure chemical vapor deposition.

The n-type polysilicon layer 222, the conductive layer 224, the anti-fuse 226, the n-type polysilicon layer 228 and the p-type polysilicon layer 218 are patterned, wherein the patterned n-type polysilicon layer 222, the patterned conductive layer 224, the patterned anti-fuse 226, and the patterned n-type polysilicon layer 228 form an array of linear third stack circuits 230 each having an n-type polysilicon/conductive layer/anti-fuse/n-type polysilicon (N/C/A/N) composite layer setup. In the same patterning process, the p-type polysilicon layer 218 is also patterned to form the p-type polysilicon layer 218a, wherein the pattern of the p-type polysilicon layer is substantially conformal to the shape of the interaction between each third stack circuit 230 and each second stack circuit 220. In essence, each second stacked circuit 220 has the p-type polysilicon layer 212, the conductive layer 214, the anti-fuse 216 and the p-type polysilicon layer 218a composite layer setup. Further, the third stack circuits 230 are oriented in the same direction as the first stack circuits 210. Thereafter, a dielectric layer 18 is formed in the space between the third stack circuits 230 and the p-type polysilicon layer 281a, for example, by performing a high-density plasma chemical vapor deposition or a spin-coating process. The dielectric layer 18 is, for example, a silicon oxide layer, a silicon nitride layer or a spin-coated glass layer.

A portion of the dielectric layer 18 is removed to expose the topmost n-type polysilicon layer 228. The dielectric layer 18 above the n-type polysilicon layer 228 is removed, for example, by chemical-mechanical polishing or conducting an etching back process.

Figure 3E:
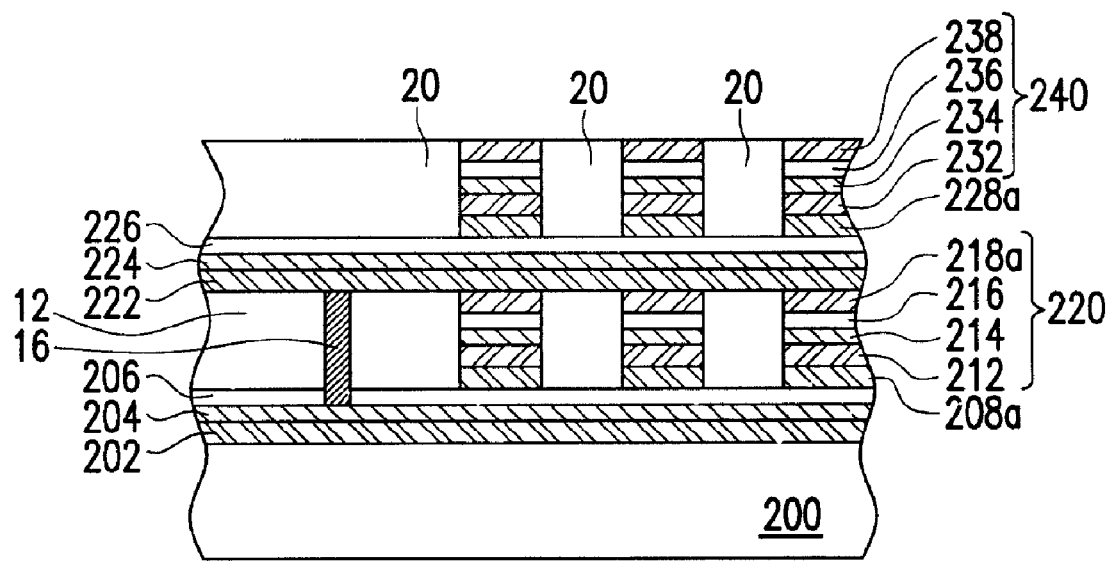
Figure 4E:
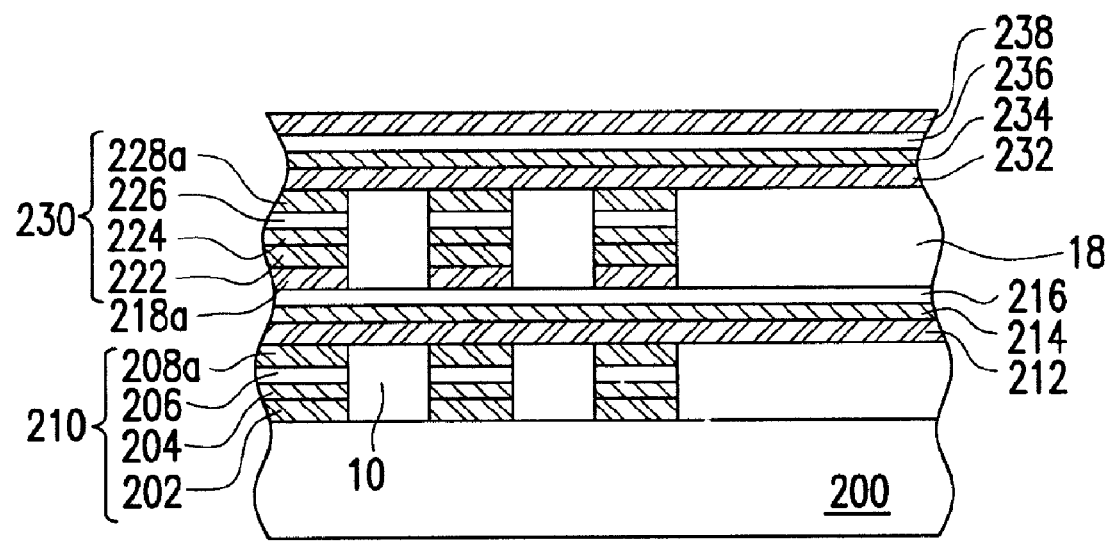

As shown in FIGS. 3E and 4E, a p-type polysilicon layer 232, a conductive layer 234, an anti-fuse 236 and another p-type polysilicon layer 238 are sequentially formed over the n-type polysilicon layer 228. The p-type polysilicon layers 232 and 238 are formed, for example, by conducting an in-situ doping using boron hydride as a gaseous source. The conductive layer 234 is a tungsten suicide layer or a titanium suicide layer, for example. The conductive layer 234 is formed, for example, by conducting a low-pressure chemical vapor deposition. The anti-fuse 236 is fabricated using a material having an etching selectivity ratio higher than the p-type polysilicon layers 232, 238 and the conductive layer 234 including, for example, silicon oxide. The anti-fuse 236 is formed, for example, by conducting a low-pressure chemical vapor deposition.

The p-type polysilicon layer 232, the conductive layer 234, the anti-fuse 236, the p-type polysilicon layer 238 and the n-type polysilicon layer 228 are patterned, wherein the patterned p-type polysilicon layer 232, the patterned conductive layer 234, the patterned anti-fuse 236, and the patterned p-type polysilicon layer 238 form an array of linear fourth stack circuits 240 each having a p-type polysilicon/conductive layer/anti-fuse/p-type polysilicon (P/C/A/P) composite layer setup. In the same patterning process, the n-type polysilicon layer 228 is also patterned to form the n-type polysilicon layer 228a, wherein the pattern of the n-type polysilicon layer 228a is substantially conformal to the shape of the interaction between each third stack circuit 230 and each fourth stack circuit 240+. In essence, each third stacked circuit 230 has the n-type polysilicon layer 222, the conductive layer 224, the anti-fuse 226, and the n-type polysilicon layer 228a composite layer setup. Further, the fourth stack circuits 240 are oriented in a direction identical to the second stack circuits 220. Thereafter, a dielectric layer 20 is formed in the space between the fourth stack circuits 240 above the anti-fuse 226. The dielectric layer 20 is, for example, a silicon oxide layer, a silicon nitride layer or a spin-coated glass layer. The dielectric layer 20 is formed, for example, by performing a high-density plasma chemical vapor deposition or a spin-coating process.

A portion of the dielectric layer 20 is removed to expose the topmost p-type polysilicon layer 238. The dielectric layer 20 above the p-type polysilicon layer 238 is removed, for example, by chemical-mechanical polishing or conducting an etching back process.

Figure 3F:
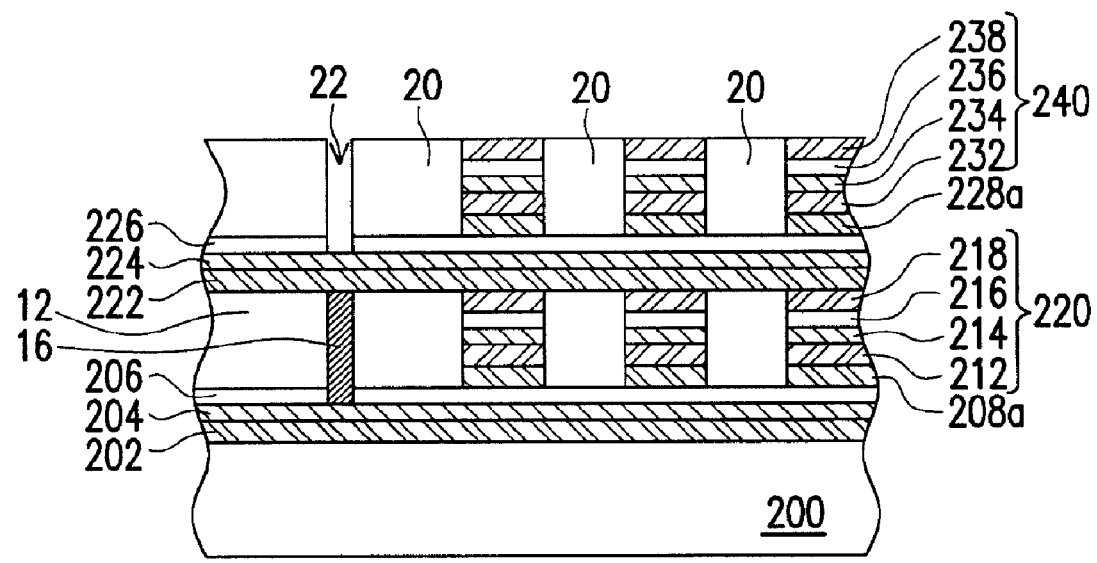
Figure 4F:
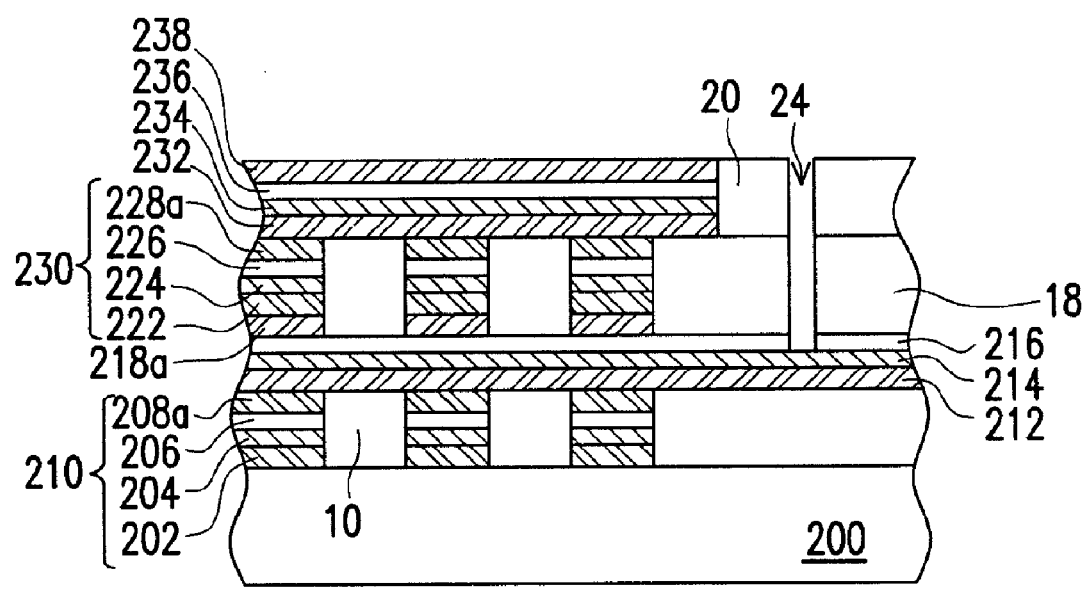

As shown in FIGS. 3F and 4F, the dielectric layer 20 and the anti-fuse 226 are patterned to form an opening 22 above the conductive layer 224. In addition, the dielectric layer 20, the dielectric layer 18 and the anti-fuse 216 are patterned to form another opening 24 above the conductive layer 214.

Figure 3G:
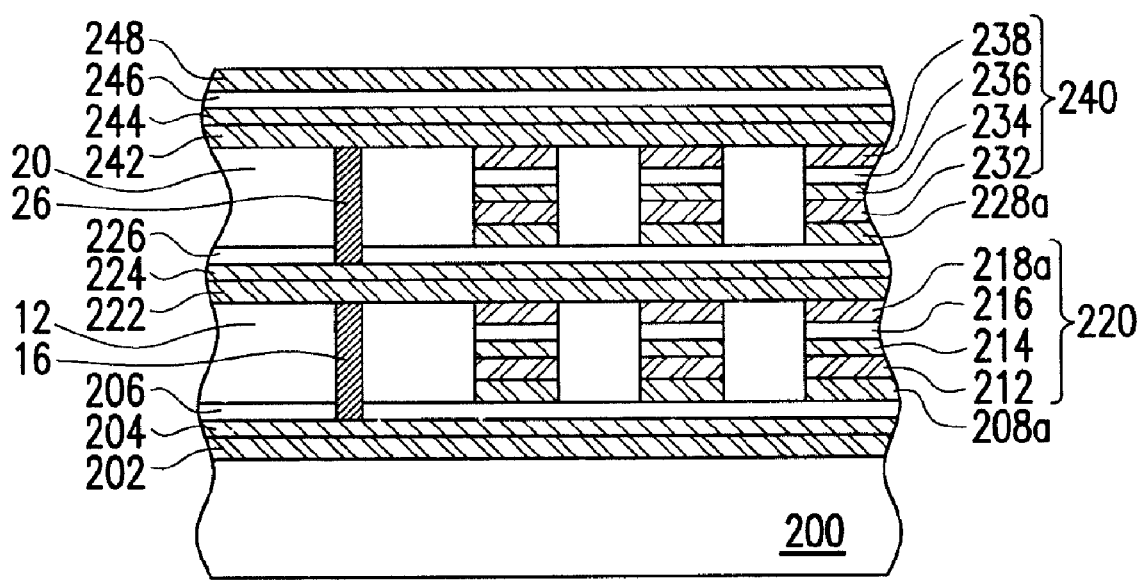
Figure 4G:
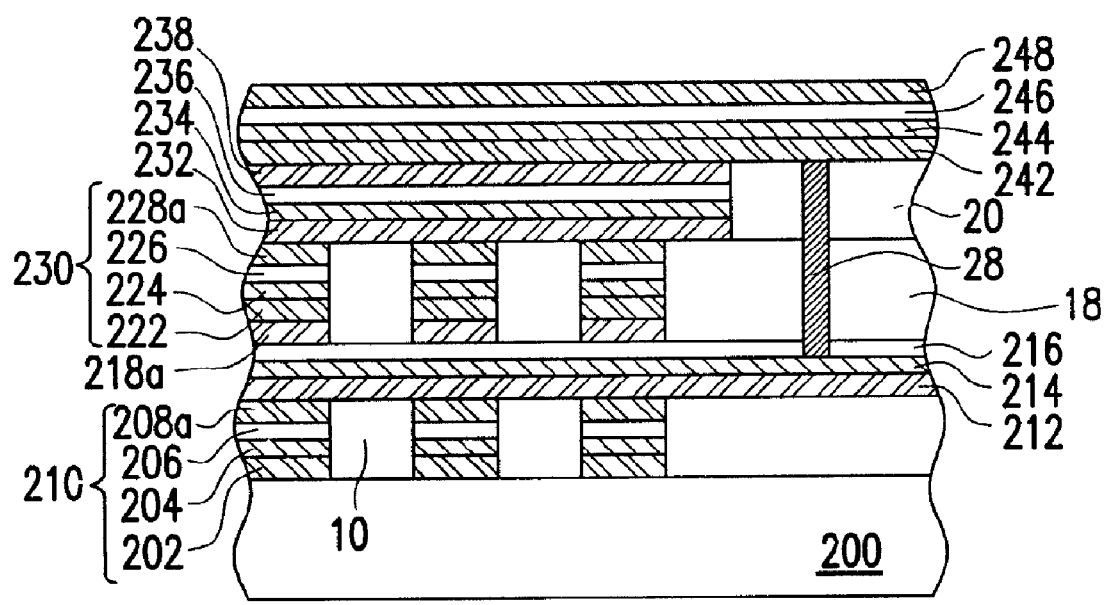

As shown in FIGS. 3G and 4G, n+ polysilicon material is deposited into the openings 22 and 24 to form plugs 26 and 28. Thereafter, an n-type polysilicon layer 242, a conductive layer 244, an anti-fuse 246 and another n-type polysilicon layer 248 are sequentially formed over the p-type polysilicon layer 238. The n+ polysilicon plug 26 connects the conductive layer 224 and the n-type polysilicon layer 242 electrically. The n+ polysilicon plug 28 connects the conductive layer 214 and the n-type polysilicon layer 242 electrically.

The aforementioned steps may be repeated to stack alternately crossed circuits above the substrate so that a truly three-dimensional memory structure is formed.

In this invention, a three-dimensional multi-layered memory array structure is produced. The odd-numbered memory cell array and the even-numbered memory cell array of the three-dimensional structure are alternately stacked over each other and oriented in a direction perpendicular to each other above the substrate. Hence, substrate area required to accommodate the memory device is reduced and overall level of integration of the memory chip is increased. Moreover, in the fabrication process, the anti-fuse is used as an etching stop layer. Since the anti-fuse is fabricated from silicon oxide, the anti-fuse has a relatively high etching selectivity ratio relative to the polysilicon and the conductive layer. Therefore, the processing window is increased and the steps for fabricating the three-dimensional memory are simplified. Furthermore, the steps of forming via is to break through the anti-fuse after etching stop on the anti-fuse, so it can effectively etch stop on the conductive layer. Therefore, it can prevent via from forming p-n or n-p rectification junction due to the conductive layer being perforated, resulting in non-conducting.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A three-dimensional memory structure, comprising:
   a first stack line, having:
      a first first-type polysilicon layer;
      a second first-type polysilicon layer;
      a first conductive layer between the first first-type polysilicon layer and the second first-type polysilicon layer; and
      a first anti-fuse between the first first-type polysilicon layer and the second first-type polysilicon layer; and
   a second stack line crossing over the first stacked line, having:
      a first second-type polysilicon layer;
      a second second-type polysilicon layer;
      a second conductive layer between the first second-type polysilicon layer and the second second-type polysilicon layer; and
      a second anti-fuse between the first second-type polysilicon layer and the second second-type polysilicon layer, wherein each layer of the second stack line crosses over each layer of the first stack line.

2. The memory structure of claim 1, wherein the first-type polysilicon layer comprises an n-type polysilicon layer.

3. The memory structure of claim 2, wherein the second-type polysilicon layer comprises a p-type polysilicon layer.

4. The memory structure of claim 1, wherein the first-type polysilicon layer comprises a p-type polysilicon layer.

5. The memory structure of claim 4, wherein the second-type polysilicon layer comprises an n-type polysilicon layer.

6. The memory structure of claim 1, wherein a material of the first anti-fuse and the second anti-fuse comprises oxide.

7. The memory structure of claim 1, wherein a material of the first conductive layer comprises tungsten silicide.

8. The memory structure of claim 1, wherein a material of the second conductive layer comprises tungsten silicide.

9. The memory structure of claim 1, wherein a material of the first conductive layer comprises titanium silicide.

10. The memory structure of claim 1, wherein a material of the second conductive layer comprises titanium silicide.

11. A three-dimensional memory structure, comprising:
    a plurality of first stack lines, wherein each first stack line comprises:
       an upper first-type polysilicon layer;
       a lower first-type polysilicon layer;
       a first conductive layer between the upper and the lower first-type polysilicon layers; and
       a first anti-fuse between the upper first-type polysilicon layer and the lower first-type polysilicon layer, wherein the layers of each first stack line are configured in parallel strips;
    a first dielectric layer in a space between the first stack lines;
    a plurality of second stack lines crossing over the plurality of the first stack lines, wherein a pattern of the upper first-type polysilicon layer is substantially conformal to a shape of an intersection between each second stack line and each first stack line, wherein each second stack line comprises:
       an upper second-type polysilicon layer;
       a lower second-type polysilicon layer;
       a second conductive layer between the upper second-type polysilicon layer and the lower second-type polysilicon layer; and
       a second anti-fuse between the upper second-type polysilicon layer and the lower second-type polysilicon layer; and
    a second dielectric layer in a space between the second stack lines.

12. The memory structure of claim 11, wherein the first anti-fuse comprises an oxide material.

13. The memory structure of claim 11, wherein the second anti-fuse comprises an oxide material.

14. The memory structure of claim 11, wherein while the first-type polysilicon layer comprises a p-type polysilicon layer, the second-type polysilicon layer comprises an n-type polysilicon layer.

15. The memory structure of claim 11, wherein while the first-type polysilicon layer comprises an n-type polysilicon layer, the second-type polysilicon layer comprises a p-type polysilicon layer.

16. A three-dimensional memory structure, comprising:
    a plurality of first stack lines, wherein each first stacked line comprises:
       a first upper first-type polysilicon layer;
       a first lower first-type polysilicon layer;
       a first conductive layer between the upper and the lower first-type polysilicon layers; and
       a first anti-fuse between the first upper first-type polysilicon layer and the first lower first-type polysilicon layer;
    a first dielectric layer in a space between the first stack lines;
    a plurality of second stack lines crossing over the plurality of the first stack lines, wherein a pattern of the upper first-type polysilicon layer is substantially conformal to a shape of an intersection between each second stacked line and each first stacked line, wherein each second stack line comprises:
an upper second-type polysilicon layer;
a lower second-type polysilicon layer;
a second conductive layer between the upper and the lower second-type polysilicon layers; and
a second anti-fuse between the upper and the lower second-type polysilicon layers;
a second dielectric layer in a space between the second stacked lines;
a plurality of third stacked lines crossing over the plurality of the second stacked lines, wherein a pattern of the upper second-type polysilicon layer is substantially conformal to a shape of an interaction between each third stack line and each first stack line, and wherein each third stack line comprises:
a second upper first-type polysilicon layer;
a second lower first-type polysilicon layer;
a third conductive layer between the second upper and the second lower first-type polysilicon layers; and
a third anti-fuse between the second upper first-type polysilicon layer and the second lower first-type polysilicon layer;
a third dielectric layer in a space between the third stacked lines; and
at least a plug in the second dielectric layer connecting the first conductive layer and the second lower first-type polysilicon layer.

17. The three-dimensional memory structure of claim 16, wherein the plug comprises polysilicon plug.

* * * * *